United States Patent [19]
Patel et al.

[11] Patent Number: 5,929,646
[45] Date of Patent: Jul. 27, 1999

[54] INTERPOSER AND MODULE TEST CARD ASSEMBLY

[75] Inventors: Janak Ghanshyambhai Patel, South Burlington; Dana John Thygesen, Huntington, both of Vt.

[73] Assignee: International Business Machines Corporation, Armonk, N.Y.

[21] Appl. No.: 08/766,234

[22] Filed: Dec. 13, 1996

[51] Int. Cl.$^6$ .................................................. G01R 1/07
[52] U.S. Cl. ..................................... 324/754; 324/755
[58] Field of Search .................................... 324/754, 755, 324/761–762, 765; 439/66, 482, 68, 91; 361/764, 762, 744, 718; 174/266

[56] References Cited

U.S. PATENT DOCUMENTS

| | | | |
|---|---|---|---|
| 3,541,222 | 11/1970 | Parks et al. | 174/68.5 |
| 3,982,320 | 9/1976 | Buchoff et al. | 29/630 |
| 4,202,007 | 5/1980 | Dougherty et al. | 357/80 |
| 4,707,657 | 11/1987 | Bøegh-Peterson | 324/158 |
| 4,793,814 | 12/1988 | Zifcak et al. | 439/66 |
| 4,862,076 | 8/1989 | Renner et al. | 439/68 |
| 4,954,878 | 9/1990 | Fox et al. | 361/718 |
| 4,969,826 | 11/1990 | Grabbe | 439/66 |
| 5,071,359 | 12/1991 | Arnio et al. | 439/91 |
| 5,177,594 | 1/1993 | Chance et al. | 257/678 |
| 5,207,585 | 5/1993 | Byrnes et al. | 66/439 |
| 5,347,162 | 9/1994 | Pasch | 257/773 |
| 5,408,190 | 4/1995 | Wood et al. | 324/765 |
| 5,635,846 | 6/1997 | Beaman et al. | 324/754 |
| 5,701,085 | 12/1997 | Malladi et al. | 324/754 |

OTHER PUBLICATIONS

E.W. Mace and P. Singh, Customable Multi–Contact–Point––Imposer, Apr. 1994, IBM Technical Disclosure Bulletin vol. 37 No. 04B pp. 105–106.

H. Li and P. Singh, High Density Compliant Connector and Socket, Sep. 1994, IBM Technical Disclosure Bulletin vol. 37, No. 09, pp. 395–396.

*Primary Examiner*—Vinh P. Nguyen
*Attorney, Agent, or Firm*—Schmeiser, Olsen & Watts; Eugene Shkurko

[57] ABSTRACT

The preferred embodiment of the present invention provides an apparatus and method to facilitate the testing of semiconductor devices packaged in surface mount modules (such as ball grid array modules and cylinder grid array modules) while the module is connected to a system board. The preferred embodiment provides an interposer mechanism that includes a top array of interposer landing pads and a bottom array of interposer landing pads. The bottom array of interposer landing pads are connected to the top array of interposer landing pads. The preferred embodiment also provides a module test card mechanism. The module test card mechanism includes a plurality of landing pads arranged to receive the surface mount module. The plurality of landing pads are connected to a plurality of test pins, and a plurality of landing pads underneath the module test card mechanism. The surface mount module can be coupled the system board through the module test card mechanism and the interposer mechanism with the plurality of test pins providing access to the semiconductor device for testing.

18 Claims, 3 Drawing Sheets

INTERPOSER AND MODULE TEST CARD ASSEMBLY

BACKGROUND OF THE INVENTION

1. Technical Field

This invention generally relates to semiconductor testing, and more specifically relates to testing and debugging semiconductor chips.

2. Background Art

The fabrication of integrated semiconductor devices involves forming a plurality of devices on a semiconductor wafer. The wafer is then divided up into a plurality of pieces called "chips" with each chip comprising one or more semiconductor devices. Each chip is then placed in a package that has external connections to provide accesses to signals on the chip.

Many different packages for integrated circuits have been developed. One popular package is the dual in-line package (DIP). The DIP is commonly a plastic package for many commercial applications, but also comes in ceramic packages for applications that require higher operating temperature. As the number of pins on a chip were increased, new packages were developed, such as the pin-array (PGA). A PGA package typically has rows and columns of pins in an array, and may be either plastic or ceramic as well. As the size of electronic boars continues to shrink, other packages have been developed that provide a higher density of connections in a given space.

For example, surface-mount devices have been developed that have a ceramic package (or module) with solder pads that provide connections to the integrated circuit. These solder pads may be made much smaller than the area required by a pin in prior art DIP and PGA packages, resulting in a higher connection density.

Surface mount modules may be mounted on a variety of different types of circuit boards, circuit modules, or other substrates, referred to herein generically as a "system board". A system board designed to receive a surface mount module typically provides landing pads that align with the landing pads on the module. Solder balls or solder bumps may be formed on either the module landing pads, the system board landing pads, or both. The surface mount module is then placed on the system board and the entire assembly is heated until the solder balls flow and form a good electrical connection between landing pads. The array of solder balls thus serve as an interconnect mechanism between the landing pads on the module and the landing pads on the system board.

As an example of surface mount modules, ball grid array (BGA) and column grid array (CGA) chip carrier modules have used arrays of solder balls or columns (sometimes referred to as cylinders) as input and output connections. In this application, the term "solder balls" will be used generically to refer to the balls, bumps, columns, cylinders or other suitable connections used as surface mount module interconnects. Generally, the array of solder balls are arranged on a dense pitch of 1.0 and 1.27 millimeters. With a dense array of solder balls covering one side of the module, BGA and CGA modules can provide a large number of input and output connections to the chip in the module without using excessive space.

In BGA and CGA modules the array of solder balls and columns are connected to the chips in the modules by a corresponding array of landing pads on the surface of the chip. These landing pads are generally part of the last metal layer interconnect from the semiconductor device, and comprise metal such as aluminum (Al) and copper (Cu). These solder balls generally comprise a lead tin alloy (PbSn) or other soft metal.

When the modules are connected to the system board the modules are flipped over and placed so that the array of solder balls are aligned with the corresponding array of landing pads on the system board. The module and system board are then heated, allowing the solder paste, which is screened on an array of landing pads, to melt and flow into the system board. This establishes the physical and electrical connection between the module and the system board.

Unfortunately, the dense array of solder balls makes testing the modules very difficult. The difficultly is increased where the module must be attached to another device, such as a printed circuit board, for testing. For example, some modules must be attached to the system board before they can be completely tested. Testing these modules requires access to the solder balls be provided while the module is attached to the system board. Unfortunately, it is especially difficult, and in some cases impossible, to probe the input/output solder balls on the module when it is attached to the system board because the body of the module and the system board block access to the solder balls due to the surface mount attachment.

In the past, one way designers used to test and debug CGA and BGA modules was to form testing contact pads into the system board that provide contact points to the solder balls nodes. Unfortunately this requires additional real estate on the system board, an unacceptable solution in many cases. Additionally, these types of landing pads generally requires a specialized and expensive probing tool with a long lead time required to build it.

Another method designers have used to debug and develop CGA and BGA packaged devices was to package them in a simplified package such as a pin grid array package (PGA), with the input/output connects through standard pin outs and then design and build a specialized test system board that is used only for debugging and testing. This specialized test system board would be similar to the normal system board, but with the design changes necessary to use the PGA modules instead of the BGA or CGA module. The designer could then use an interface card to connect to the specialized test system board to the overall system for testing.

The specialized test system board would be specially designed to provide landing pads for test probes that can be used to provide access to the solder balls and connect to a logic analyzer and/or other measurement devices. Thus, the designer was able to access the pins and solder balls on the CGA or BGA module and test the module while it is connected to the overall system through the test PCB. Unfortunately, designing and building a specialized PGA package and a specialized test system board simply for the testing of the module was exceedingly time consuming and expensive. In particular, it requires the design and development of two packages, a test PGA package and a CGA or BGA module used for final packaging. Additionally, it requires special boards to be designed. The specialized test system board with its extra landing pads for testing and the normal system board without the landing pads that will be used in the final product.

Thus, what is needed is a method and apparatus to provide debugging and testing of BGA/CGA modules while on the system board or other packaging that does not require the specialized test packages or specialized test system boards, and does not require the use of valuable real estate on the system board for testing pads.

DISCLOSURE OF INVENTION

The preferred embodiment of the present invention provides an apparatus and method to facilitate the testing of semiconductor devices packaged in surface mount modules (such as ball grid array modules and cylinder grid array modules) while the module is connected to a system board. The preferred embodiment provides an interposer mechanism that includes a top array of landing pads and a bottom array of landing pads. The bottom array of interposer landing pads are connected to the top array of interposer landing pads. The preferred embodiment also provides a module test card mechanism. The module test card mechanism includes a plurality of landing pads arranged to receive the surface mount module. The plurality of landing pads are connected to a plurality of test pins, and a plurality of landing pads underneath the module test card mechanism. The surface mount module can be coupled to the system board through the module test card mechanism and the interposer mechanism with the plurality of test pins providing access to the semiconductor device for testing.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment of the present invention facilitates the testing of devices that use surface mounting such as ball grid array (BGA) modules, column grid array (CGA) modules, and flip chip modules that use solder ball or column arrays for connecting the module to the system board (which can comprise things such as printed circuit boards (PCB), semiconductor devices, and/or other packaging structures). In this application, the term "solder balls" will be used generically to refer to the balls, bumps, columns and cylinders used as module interconnects. This allows chips to be tested without the need for the chip to be packaged in a specialized module for testing or for the creation of specialized system boards for testing.

Figure 1:
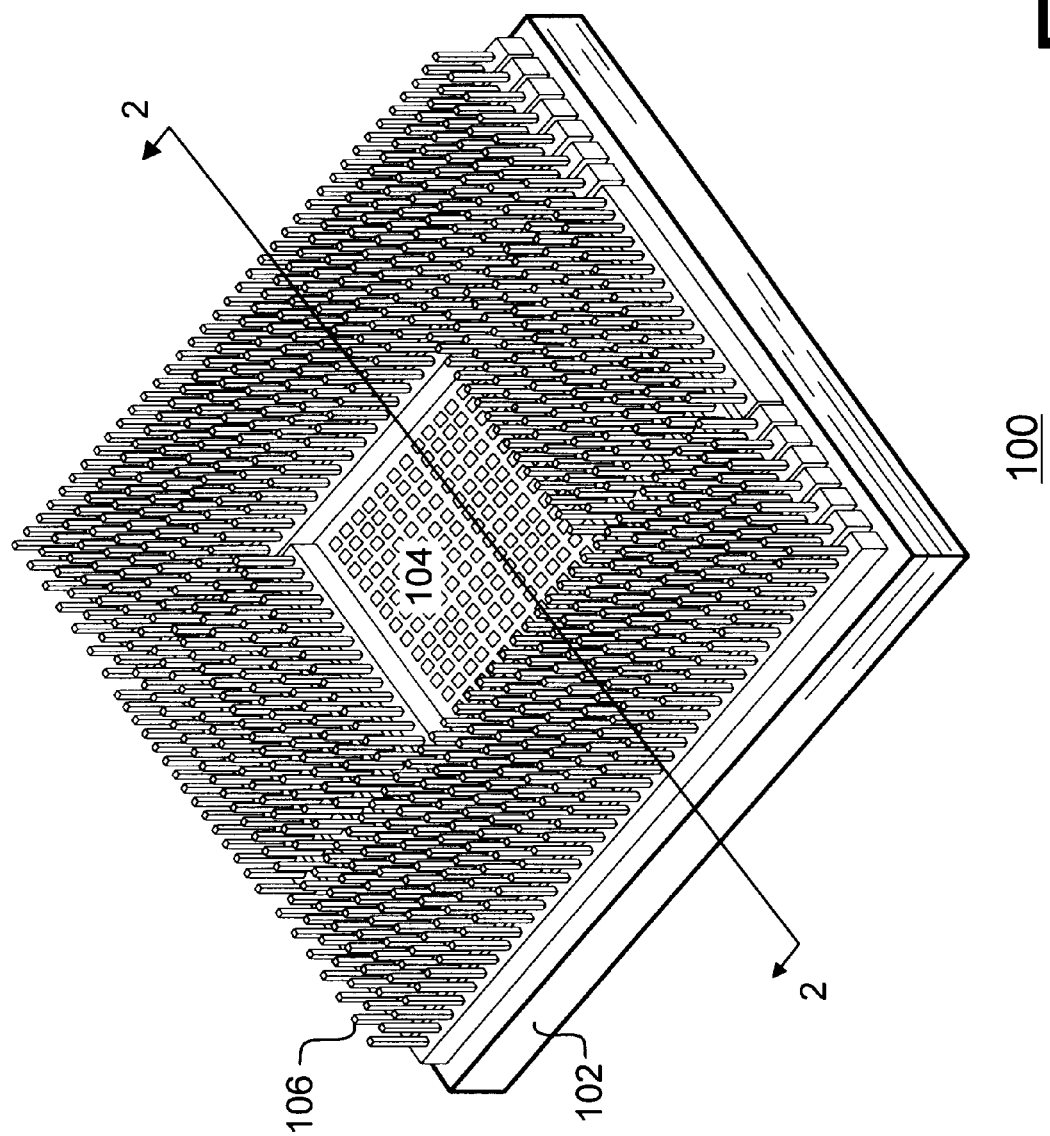
FIG. 1 is a perspective view of a test card in accordance with the preferred embodiment of the present invention.

Turning now to FIG. 1, FIG. 1 is a perspective view of a module test card 100 in accordance with preferred embodiment of the present invention. The module test card 100 comprises a substrate 102, an array of module landing pads 104, and a plurality of test pins 106 connected to the array of module landing pads 104. The module test card 100 further comprises an array of interposer landing pads (not shown in figure) on the underside of the substrate 102 that are connected to the array of module landing pads 104 and the plurality of test pins 106.

The substrate 102 can comprise any type of substrate material. For example, the substrate 102 can comprise printed circuit board material such as ceramic or fire-retardant epoxy-glass cloth (FR4). The array of module landing pads 104 comprises conductive pads fabricated into the top surface of substrate 102. The array of module landing pads 104 is preferably situated in the center of the substrate 102, with the plurality of pins 106 surrounding it. The array of landing pads 104 are preferably arranged to receive the solder ball array on the modules to be tested, i.e., in the same array pattern as the module solder balls.

Each landing pad in the array of module landing pads 104 is connected to one of the plurality of pins 106 and one of the interposer landing pads on the underside of the module test card 100 (not shown in FIG. 1). These connections are preferably copper traces formed by etching copper foil mounted on insulating material but could suitably be formed by any connection mechanism.

The plurality of pins 106 provide contact with the module solder balls when the module is attached to the module test card 100. The plurality of pins 106 are preferably arranged in an array that corresponds to the test probe to be used for testing the module. For example, the plurality of pins 106 can be arranged in a collection of Berg connectors with an industry standard 2.54 millimeter pitch as are commonly used to connect test probes to test devices such as an oscilloscope.

Figure 2:
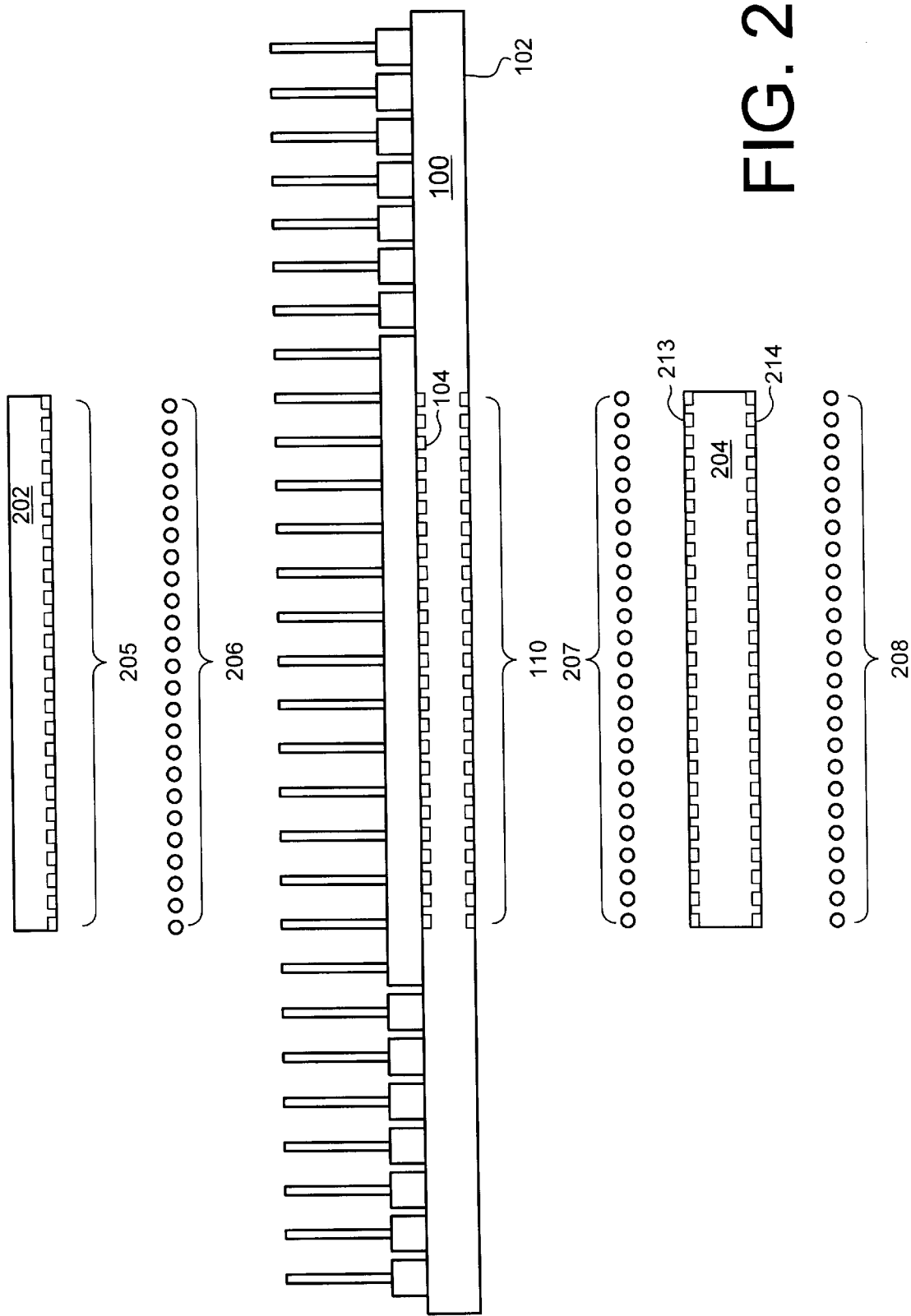
FIG. 2 is a cross-sectional side view of a semiconductor module, a test card, and an interposer in accordance with the preferred embodiment of the present invention.

Turning now to FIG. 2, FIG. 2 is a cross-sectional side view of a module 202, the test card 100, and an interposer 204. The cross section of test card 100 is taken along lines 2—2 of FIG. 1. As previously stated, the module 202 can comprise either a conventional ball grid array (BGA), column grid array (CGA), flip chip or any other type of semiconductor packaging that uses surface mount attachment with an array of connectors (such as solder balls) to connect to external devices. As such, module 202 includes an array of landing pads 205 on its underside for connection to the device inside the module 202. The module 202 is connected to other devices through an array of solder balls 206 that attach to the array of landing pads 205.

Again, the module test board 100 comprises substrate 102, an array of module landing pads 104, and a plurality of test pins 106 connected to the array of module landing pads 104. The module test card 100 further comprises an array of interposer landing pads 110 on the underside of the substrate 102 that are connected to the array of module landing pads 104 anid the plurality of test pins 106.

The interposer 204 preferably comprises a semiconductor connection mechanism with a footprint similar to that of module 202. In particular, interposer 204 preferably comprises a top array of landing pads 213 and a bottom array of landing pads 214. The landing pds 213 and 214 provide interconnection with the module test card 100 and a system board through a top array of solder balls 207 and a bottom array of solder balls 208. The body of interposer 204 preferably comprises a ceramic or FR4 circuit board material. The thickness of the interposer 204 body can be adjusted to eliminate interference between the module test card 100 and other elments on the system board. The bottom array of landing pads 214 is preferably arranged in the same array pattern as module 202 and as such can be connected to the system board in place of module 202. The top array of landing pads 213 is preferably arranged in an array pattern corresponding to the interposer array of landing pads 110.

In the most preferred embodiment, the top and bottom array of landing pads 213 and 214 are both arranged in the same pattern, with the same pitch and spacing as the array of landing pads 205 on module 202.

Each landing pad on the top array of landing pads 213 is connected to the corresponding landing pad on the bottom array of landing pads 214 through a plurality of connection vias (not shown in figure). Where the body of the interposer 204 comprises FR4 the connection vias are preferably formed of copper plated holes filled with solder. Where the body of interposer 204 comprises ceramic the interconnection vias are preferably holes filled with tungsten or molybdenum. Of course, other suitable interconnection mechanisms can be used to connect the top array of landing pads 213 with the corresponding bottom array of landing pads 214.

Figure 3:
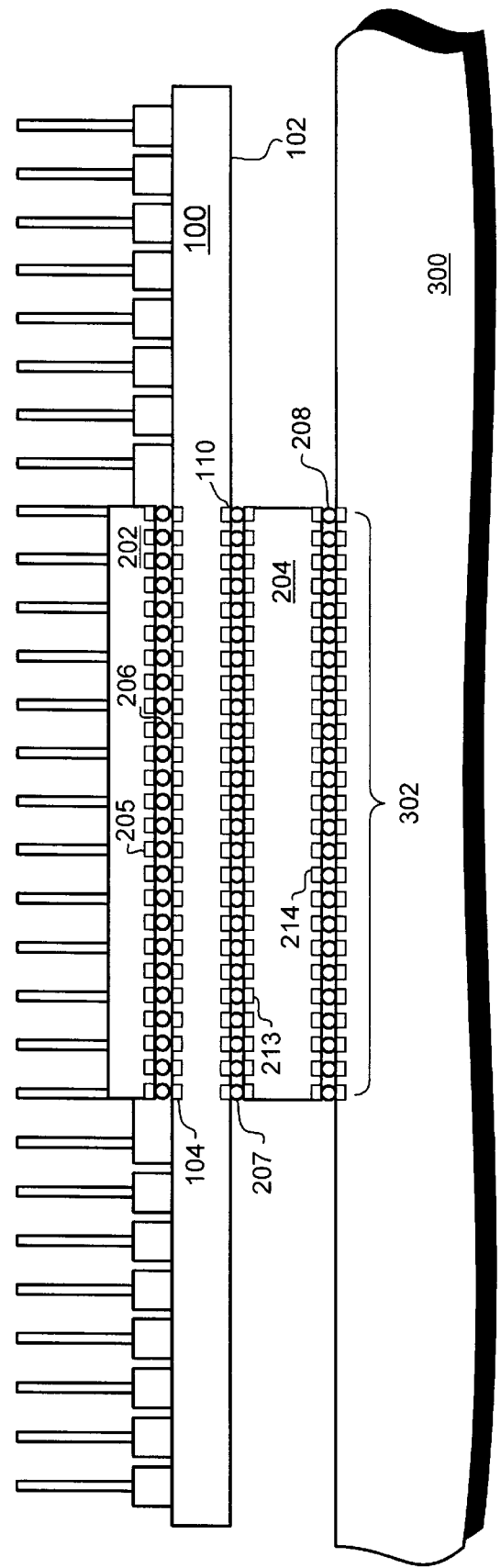
FIG. 3 is a cross-sectional side view of the semiconductor module, the test card, the interposer and a system board connected together in accordance with the preferred embodiment of the present invention.

Turning now to FIG. 3, the interposer 204 and module test card 100 is illustrated connecting module 202 to system board 300 while providing pin connections to facilitate the testing of module 202. The system board 300 includes an array of landing pads 302. The landing pads 302 are arranged to receive module 202. In normal operation, the module 202 is placed directly on the plurality of landing pads 302 to connect module 202 to system 300.

For test purposes interposer 204 is placed on the landing pads 302. Because the bottom array of landing pads 214 are arranged with the same pitch and pattern as the module 202 the interposer aligns correctly with the landing pads 302 through the bottom array of solder balls 208.

Likewise, the top array of landing pads 213 are arranged to align with the landing pads 110 on module test card 100. The module test card 100 is thus placed on top the interposer 204 such that the top array of landing pads 213 207 aligns with the interposer landing pads 110 and is connected to the interposer through the top array of solder balls 207.

The module landing pads 104 are arranged to align with the solder balls 206 on the underside of module 202. Module 202 is thus placed atop the test card 100 aligned with the array of module landing pads 104.

To attach module 202, module test card 100 and interposer 204 the top array of solder balls of interpoer 204 are first attached to the bottom array of landing pads 110 of module test card 100. The module 202 can then be attached to the module test card 100 in two ways. In the first way, the bottom array of solder balls 206 of module 202 are attached to the top landing pads 104 of the module test card 100 using industry standard surface mount reflow processes. In the alternative, the bottom array of solder balls 206 of module 202 can be plugged into the socket which has the same landing pad array pattern as the landing pad array 104 of module test card 100. The entire system is then attached to the system board 300 using industry standard surface mount attachment procedures.

Thus, the module 202 is connected to the test card 100 through the array of solder balls 206. This connection is such that each solder ball in the array 206 is connected to one of the plurality of pins 106. Furthermore, each of the solder balls in solder ball array 206 is connected to the interposer 204 through the interposer landing pads 110. The interposer 204 completes the connection to system card 300 through top array of solder balls 207, top array of landing pads 213, bottom array of landing pads 214 and bottom array of solder balls 208.

Thus, the module test card 100 and the interposer 204 connect the input/output solder ball connectors 206 of the module 202 to the system board 300 in the same way they would be if connected directly. Thus, the module 202 is electrically connected to the system board 300 and will operate as such. At the same time, all of the solder ball input/output nodes of module 202 can be accessed through one of the plurality of test pins 106. This allows the module 202 to be fully tested in operational mode, with it connected to the system board 300.

Thus, the preferred embodiment provides an apparatus and method for fully debugging and testing of devices in surface mount modules (such as BGA/CGA modules) while on the system board or other packaging and does not require the chip to be mounted in a specialized module or require specialized test system boards. Furthermore, it does not require the use of valuable real estate on the system board for testing pads.

While the invention has been particularly shown and described with reference to preferred exemplary embodiments thereof, it will be understood by those skilled in the art that variations in form and detail may be made therein without departing from the spirit and scope of the invention.

We claim:

1. An apparatus to facilitate testing of a semiconductor device in a surface mount module while said semiconductor device is connected to a system board, the apparatus comprising:

a) an interposer mechanism, said interposer mechanism including a top array of interposer landing pads and a bottom array of interposer landing pads, said bottom array of interposer landing pads connected to said top array of interposer landing pads; and b) a module test card mechanism, said module test card mechanism including a first plurality of landing pads arranged to receive the surface mount module and having a second plurality of landing pads arranged to connect with said top array of interposer landing pads, said module test card mechanism further including a plurality of test pins electrically connected to said first plurality of landing pads and to said second plurality of landing pads.

2. The apparatus of claim 1 wherein said top array of interposer landing pads are arranged to receive a top array of interposer interconnection balls and said bottom array of interposer landing pads are arranged to receive a bottom array of interposer interconnection balls and wherein said second plurality of landing pads are arranged to receive said top array of interposer interconnection balls.

3. The apparatus of claim 2 wherein said surface mount module comprises an array of module interconnection balls electrically connected to the system board and to said plurality of pins when said module is coupled to said first plurality of landing pads and when said top array of interposer interconnection balls are coupled to said second plurality of landing pads and said top array of interposer landing pads and when said bottom array of interposer interconnection balls are coupled to bottom array of interposer landing pads and said array of system board landing pads.

4. The apparatus of claim 1 wherein said surface mount module comprises a ball grid array module.

5. The apparatus of claim 1 wherein said surface mount module comprises a cylinder grid array module.

6. The apparatus of claim 1 wherein said surface mount module comprises a flip chip module.

7. The apparatus of claim 1 wherein said bottom array of interposer interconnection balls comprises solder balls.

8. The apparatus of claim 1 wherein said bottom array of interposer interconnection balls comprises cylinders.

9. The apparatus of claim 1 wherein said top array of interposer interconnection balls comprises solder balls.

10. The apparatus of claim 1 wherein said top array of interposer interconnection balls comprises cylinders.

11. The apparatus of claim 1 wherein said module test card mechanism comprises a printed circuit board.

12. The apparatus of claim 1 wherein said interposer mechanism comprises a printed circuit board.

13. The apparatus of claim 1 wherein said plurality of test pins comprise an array of pins arranged in rows and columns with each pin located equidistant from neighboring pins.

14. A method for testing a semiconductor device in a surface mount module when said semiconductor device is connected to a system board, the method comprising the steps of:

a) providing an interposer mechanism, said interposer mechanism including a top array of landing pads and a bottom array of interposer landing pads, said bottom array of interposer landing pads connected to said top array of interposer landing pads, said top array of interposer landing pads arranged to receive a top array of interposer interconnection balls and said bottom array of interposer landing pads arranged to receive a bottom array of interposer interconnection balls;

b) providing a module test card mechanism, said module test card mechanism including a first plurality of landing pads arranged to receive said surface mount module and having a second plurality of landing pads arranged to receive said top array of interposer interconnection balls and further comprising a plurality of test pins, said-purality of test pins electrically connected to said first plurality of landing pads and to said second plurality of landing pads;

c) connecting said surface mount module to said first plurality of landing pads, connecting said top array of interposer interconnection balls to said second array of landing pads and to said top array of interposer landing pads and connecting said bottom array of interposer interconnection balls to said bottom array of interposer interconnection balls and to said system board; and d) testing said semiconductor device and monitoring test results via signals on the plurality of test pins.

15. The method of claim 14 wherein said surface mount module comprise a ball grid array module.

16. The method of claim 14 wherein said surface mount module comprise a cylinder grid array module.

17. The method of claim 14 wherein said surface mount module comprises a flip chip module.

18. An apparatus to facilitate testing of a semiconductor device packaged in a surface mount module, said surface mount module having an array of module interconnection balls, while said semiconductor device is connected to a system board, said system board having an array of system board landing pads, the apparatus comprising:

a) an interposer mechanism, said interposer mechanism including a top array of landing pads and a bottom array of interposer landing pads, each of said bottom array of interposer landing pads connected to at least one of said top array of interposer landing pads, said top array of interposer landing pads arranged to receive a top array of interposer interconnection balls and said bottom array of interposer landing pads arranged to receive a bottom array of interposer interconnection balls;

b) a module test card mechanism, said module test card mechanism including a first plurality of landing pads arranged to receive said array of module interconnection balls and having a second plurality of landing pads arranged to receives said top array of interposer interconnection balls and further comprising a plurality of test pins, each of said test pins electrically connected to at least one of said first plurality of landing pads and to at least one of said second plurality of landing pads; and c) wherein said array of module interconnection balls are electrically connected to the system board and to said plurality of pins when said module is coupled to said first plurality of landing pads and said top array of interposer landing pads are coupled to said second plurality of landing pads through said top array of interposer interconnection balls and said bottom array of interposer landing pads are coupled to said array of system board landing pads through said bottom array of interposer interconnection balls.

* * * * *